United States Patent
Ohtaki et al.

(10) Patent No.: US 7,454,180 B2
(45) Date of Patent: Nov. 18, 2008

(54) VEHICLE-MOUNTED RECEIVING APPARATUS FOR REDUCING DISTORTION, IMPROVING RECEPTION SENSITIVITY, AND SAVING POWER

(75) Inventors: Yukio Ohtaki, Fukushima-ken (JP); Toru Oyama, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 443 days.

(21) Appl. No.: 11/388,939

(22) Filed: Mar. 23, 2006

(65) Prior Publication Data
US 2006/0264111 A1   Nov. 23, 2006

(30) Foreign Application Priority Data
May 23, 2005   (JP) .............................. 2005-149662

(51) Int. Cl.
*H04B 7/08* (2006.01)
(52) U.S. Cl. .................. 455/132; 455/245.1; 455/272; 455/345; 455/575.9; 375/346
(58) Field of Classification Search ......... 455/132, 455/150.1, 232.1, 234.1, 245.1, 269, 272, 455/344, 345, 347, 351, 552.1, 553.1, 575.1, 455/575.9, 90.3; 375/345, 346
See application file for complete search history.

(56) References Cited

U.S. PATENT DOCUMENTS 6,009,129 A * 12/1999 Kenney et al. ............... 375/346
6,600,913 B1 * 7/2003 Brankovic et al. ........... 455/324
6,721,549 B2 * 4/2004 Lee et al. .................. 455/234.1
6,831,957 B2 * 12/2004 Chen ........................ 375/345
2001/0021644 A1   9/2001 Jang ............................ 455/295

FOREIGN PATENT DOCUMENTS

| EP | 0447194 | 9/1991 |
| EP | 0874452 | 10/1998 |
| EP | 1677436 | 7/2006 |
| JP | 11-46151 | 2/1999 |
| JP | 2000-41020 | 2/2000 |

OTHER PUBLICATIONS

European Examination report dated Jun. 22, 2007 for European application No. 06008796.2-2411.

* cited by examiner

*Primary Examiner*—Quochien B Vuong
(74) *Attorney, Agent, or Firm*—Beyer Law Group LLP

(57) ABSTRACT

A first low-noise amplifier is connected to a first receiving processing unit through a first cable and a bypass circuit is provided in parallel to the first low-noise amplifier so as to bypass the first low-noise amplifier. In the case that the intensity of broadcasting signal is more than a predetermined value, when the C/N is more than a first predetermined value and less than a second predetermined value higher than the first predetermined value, the broadcasting signal is transmitted to the first cable through the first low-noise amplifier, and when the C/N is less than the first predetermined value or more than the second predetermined value, the broadcasting signal is not input to the first low-noise amplifier but transmitted to the first cable through the bypass circuit.

9 Claims, 5 Drawing Sheets

VEHICLE-MOUNTED RECEIVING APPARATUS FOR REDUCING DISTORTION, IMPROVING RECEPTION SENSITIVITY, AND SAVING POWER

BACKGROUND OF THE INVENTION

1. Field of the Invention

The present invention relates to the vehicle-mounted receiving apparatus suitable for receiving while moving, such as a vehicle-mounted television or a portable television.

2. Description of the Related Art

A vehicle-mounted diversity receiving apparatus according to the related art will be described with reference to FIG. 9. High frequency signals, of an OFDM (orthogonal frequency division multiplexing) system, having the same frequencies that are received through receiving antennas 1 and 5 are amplified by high frequency receivers 2 and 6 and are then input to mixers 3 and 7, respectively. Local oscillation signals, of which frequencies are different from each other but adjacent to each other, are applied to the mixers 3 and 7 from local oscillators 4 and 8. For this reason, the mixers 3 and 7 output intermediate frequency signals of which frequencies are different from each other but adjacent to each other. The intermediate frequency signals output from the respective mixers 3 and 7 are synthesized by a synthesizer 9. After the synthesized signals are output from the synthesizer 9, the clock to be used in the receiving apparatus is regenerated by a synchronization circuit 10, and digital signals are obtained by an A/D converter 11.

The digital signals are converted into signals corresponding to carrier waves of the respective frequencies that form the OFDM signals by means of an FFT 12, and are then diversity-synthesized by a synthesizing circuit 13. Then, the digital signals are demodulated by a carrier wave demodulating circuit 14 for each carrier wave. In addition, after an error correction is performed by an error correcting circuit 15, the digital signals are output as digital output data (for example, see JP-A-2000-041020 (FIG. 1)).

When the above-described diversity receiving apparatus is mounted on a vehicle so as to receive television signals and signals such as GPS signals, each of the antennas is mounted on a front glass of the vehicle, and the antennas are connected to a main body of a receiver inside the vehicle through cables.

When a receiving apparatus mounted on a moving body receives television signals, the range of a change in the electric field intensity caused by movement is so large that the electric field intensity may change within a range of +10 dBm to −90 dBm, for example. For this reason, when OFDM-modulated signals, such as terrestrial digital television signals, having a number of carriers, are received in a strong electric field region, the distortion occurs in an amplifier provided in a high frequency receiver. Accordingly, a carrier-to-noise ratio (C/N) is deteriorated, so that a receiving error occurs.

SUMMARY OF THE INVENTION

The invention has been finalized in view of the inherent drawbacks in the related are, and it is an object of the invention to provide a vehicle-mounted receiving apparatus capable of reducing distortion, improving receiving sensitivity, and saving power.

In order to solve the above-described problems, according to an aspect of the invention, a vehicle-mounted receiving apparatus included: a first antenna that receives a broadcasting signal; a first low-noise amplifier connected to the first antenna; and a first receiving processing unit that is provided at a back stage of the first low-noise amplifier and detects at least the receiving intensity and the C/N during demodulation of the broadcasting signal. The first low-noise amplifier is connected to the first receiving processing unit through a first cable and a bypass circuit is provided in parallel to the first low-noise amplifier so as to bypass the first low-noise amplifier. In a case in which the intensity of the broadcasting signal is more than a predetermined value, when the C/N is more thatn a first predetermined value and less than a second predetermined value higher than the first predetermined value, the broadcasting signal is transmitted to the first cable through the first low-noise amplifier, and when the C/N is less than the first predetermined value or more than the second predetermined value, the broadcasting signal is not input to the first low-noise amplifier but transmitted to the first cable through the bypass circuit.

In the vehicle-mounted receiving apparatus, preferably, in a case in which the intensity of the broadcasting signal is less than the predetermined value, when the C/N is less than the the second predetermined value, the broadcasting signal is transmitted to the first cable through the first low-noise amplifier, and when the C/N is more than the second predetermined value, the broadcasting signal is not input to the first low-noise amplifier but transmitted to the first cable through the bypass circuit.

Further, in the vehicle-mounted receiving apparatus, preferably, the bypass circuit is formed of an off-through switching circuit in which the bypass circuit is turned off when a power supply voltage is applied and the bypass circuit is turned on when the power supply voltage is not applied. The first receiving processing unit is provided with a switching unit through which the power supply voltage is supplied to the first cable, and the power supply voltage is supplied to t he first low-noise amplifier and the off-through switching circuit through the first cable. When the terrestrial digital broadcasting signal is transmitted to the first cable through the first low-noise amplifier, the power supply voltage is supplied to the first cable through the switching unit, and when the broadcasting signal is transmitted to the first cable through the bypass circuit, the switching unit stops the power supply voltage from being supplied to the first cable.

Furthermore, in the vehicle-mounted receiving apparatus, preferably, the broadcasting signal is a terrestrial digital broadcasting signal that is OFDM demodulated, and the first receiving processig unit includes a frequency converting unit, a first OFDM demodulator connected to a back stage of the frequency converting unit, a receiving intensity detection unit that detects the receiving intensity of the terrestrial digital broadcasting signal on the basis of an intermediate frequency signals output from the frequency converting unit, and a switch controller that controls an on/off state of the switching unit. The first OFDM demodulator detects C/N information corresponding to the C/N value and outputs the receiving intensity information and the C/N information corresponding to the receiving intensity to the switch controller.

Furthermore, in the vehicle-mounted receiving apparatus, preferably, in the first receiving processing unit includes a variable gain amplifier disposed at a front stage of the frequency converting unit, and a voltage corresponding to the receiving intensity is supplied to the variable gain amplifier so as to control the gain of the variable gain amplifier.

Furthermore, in the vehicle-mounted receiving apparatus, preferably, the vehicle-mounted receiving apparatus further includes: a second antenna that receives a broadcasting signal; a second low-noise amplifier connected to the second antenna; and a second receiving processing unit provided at a back stage of the second low-noise amplifier. The second low-noise amplifier and the second receiving processingg unit are connected to each other through a second cable, and a second OFDM demodulator is provided in the second receiving processing unit. The terrestrial digital broadcasting signal is input to the second low-noise amplifier without being attenuated, regardless of variations in the receiving intensity of the terrestrial digital broadcasting signal. A demodulated signal output from the first OFDM demodulator and a demodulated signal output from the second OFDM demodulator are input to a synthesizer.

Furthermore, in the vehicle-mounted receiving apparatus, preferably, in the first low-noise amplifier and the bypass circuit are constructed inside an antenna module that is formed as one unit, and the antenna module and the first antenna are mounted on an inner side of a glass of a vehicle.

Furthermore, in a vehicle-mounted receiving apparatus, preferably, the first antenna is mounted on an inner side of a front glass or a rear glass of a vehicle.

Furthermore, in the vehicle-mounted receiving apparatus, preferably, the first low-noise amplifier, the bypass circuit, and the second low-noise amplifier are constructed inside the antenna module that is formed as one unit, and the antenna module and the first and second antennas are mounted on an inner side of a front glass or a rear glass of a vehicle, and the first and second antennas are mounted on both sides of the antenna module so as to be separated from each other.

According to the invention, the vehicle-mounted receiving apparatus includes: the first antenna that receives a broadcasting signal; the first low-noise amplifier connected to the first antenna; and the first receiving processing unit which is provided at the back stage of the first low-noise amplifier and detects at least the receiving intensity and the C/N during demodulation of the broadcasting signal. The first low-noise amplifier is connected to the first receiving processing unit through the first cable, and the bypass circuit is provided in parallel to the first low-noise amplifier so as to bypass the first low-noise amplifier. In the case in which the intensity of the broadcasting signal is more than a predetermined value, when the C/N is more than the first predetermined value and less than the second predetermined value higher than the first predetermined value, the broadcasting signal is transmitted to the first cable through the first low-noise amplifier, and when the C/N is less than the first predetermined value or more than the second predetermined value, the broadcasting signal is not input to the first low-noise amplifier but transmitted to the first cable through the bypass circuit. Accordingly, when the C/N is between the first predetermined value C1 and the second predetermined C2, it is possible to increase the receiving intensity, and when the C/N is less than the first predetermined value, it is possible to prevent the C/N from further deteriorating and to reduce power consumptioin, and even when the C/N is more than the second predetermined value, it is possible to reduce the power consumption while keeping the C/N high.

Further, according to the invention, in the case in which the intensity of the broadcasting signal is less than the predetermined value, when the C/N is less than the second predetermined value, the broadcasting signal is transmitted to the first cable through the first low-noise amplifier, and when the C/N is more than the second predetermined value, the broadcasting signal is not input to the first low-noise amplifier but transmitted to the first cable through the bypass circuit. Accordingly, when the C/N is more than the second predetermined value, it is possible to increase the receiving intensity, and when the C/N is more than the second predetermined value, it is possible to reduce the power consumption while keeping the C/N high.

Furthermore, according to the invention, the bypass circuit is formed of an off-through switching circuit in which the bypass circuit is turned off when a power supply voltage is applied and the bypass circuit is turned on when the power supply voltage is not applied. The first receiving processing unit is provided with a switching unit through which the power supply voltage is supplied to the first cable, and the power supply voltage is supplied to the first low-noise amplifier and the off-through switching circuit through the first cable. When the terrestrial digital broadcasting signal is transmitted to the first cable through the first low-noise amplifier, the power supply voltage is supplied to the first cable through the switching unit, and when the broadcasting signal is transmitted to the first cable through the bypass circuit, the switching unit stops the power supply voltage from being supplied to the first cable. Accordingly, on the basis of whether or not the power supply voltage is applied, operation modes of the first low-noise amplifier and the bypass circuit are switched.

In addition, according to the invention, the broadcasting signal is a terrestrial digital broadcasting signal that is OFDM demodulated, and the first receiving processing unit includes a frequency converting unit, a first OFDM demodulator connected to a back stage of the frequency converting unit, a receiving intensity detection unit that detects the receiving intensity of the terrestrial digital broadcasting signal on the basis of an intermediate frequency signal output from the frequency converting unit, and a switch controller that controls an on/off state of the switching unit. The first OFDM demodulator detects C/N information corresponding to the C/N value and outputs the receiving intensity information and the C/N information corresponding to the receiving intensity to the switch controller. Accordingly, it is possible to provide a terrestrial digital broadcasting receiving apparatus which can control whether or not to apply the power supply voltage on the basis of the receiving intensity information and the C/N information.

In addition, according to the invention, the first receiving processing unit includes a variable gain amplifier disposed at a front stage of the frequency converting unit, and a voltage corresponding to the receiving intensity is supplied to the variable gain amplifier so as to control the gain of the variable gain amplifier. Accordingly, it is possible to make constant the level of intermediate frequency signal to be input to the first OFDM demodulator.

In addition, according to the invention, the vehicle-mounted receiving apparatus further includes: a second antenna that receives a broadcasting signal; a second low-noise amplifier connected to the second antenna; and a second receiving processing unit provided at a back stage of the second low-noise amplifier. The second low-noise amplifier and the second receiving processing unit are connected to each other through a second cable, and a second OFDM demodulator is provided in the second receiving processing unit. The terrestrial digital broadcasting signal is input to the second low-noise amplifier without being attenuated, regardless of variations in the receiving intensity of the terrestrial digital broadcasting signal. A demodulated signal output from the first OFDM demodulator and a demodulated signal output from the second OFDM demodulator are input to a synthesizer. Accordingly, it is possible to provide a diversity receiving apparatus in which the deviation of synchronization during demodulation does not occur.

In addition, according to the invention, the first low-noise amplifier and the bypass circuit are constructed inside an antenna module that is formed as one unit and the antenna module and the first antenna are mounted on an inner side of a glass of a vehicle. Accordingly, it is possible to provide the apparatus by only connecting the antenna module to the receiving processing unit by means of the cable.

In addition, according to the invention, since the first antenna is mounted on an inner side of a front glass or a rear glass of a vehicle, it is difficult that the antenna falls off from the glass.

In addition, according to the invention, the first low-noise amplifier, the bypass circuit, and the second low-noise amplifier are constructed inside the antenna module that is formed as one unit, and the antenna module and the first and second antennas are mounted on an inner side of a front glass or a rear glass of a vehicle, and the first and second antennas are mounted on both sides of the antenna module so as to be separated from each other. Accordingly, it is possible to perform the diversity reception.

DESCRIPTION OF THE PREFERRED EMBODIMENT

Figure 6:
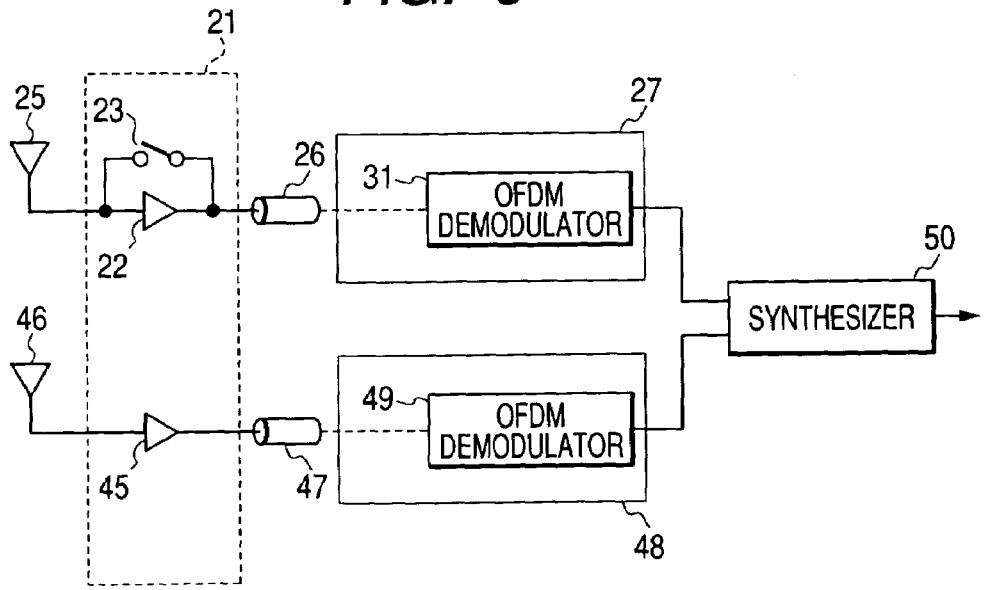
FIG. 6 is a block diagram illustrating a vehicle-mounted receiving apparatus according to the second embodiment of the invention.
Figure 7:
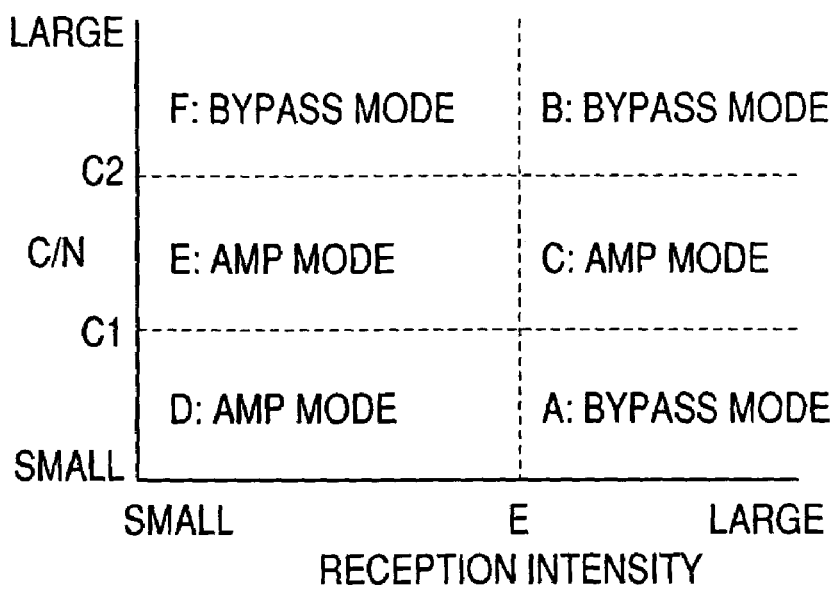
FIG. 7 is a view illustrating the operation mode of an antenna module according to the invention.
Figure 8:
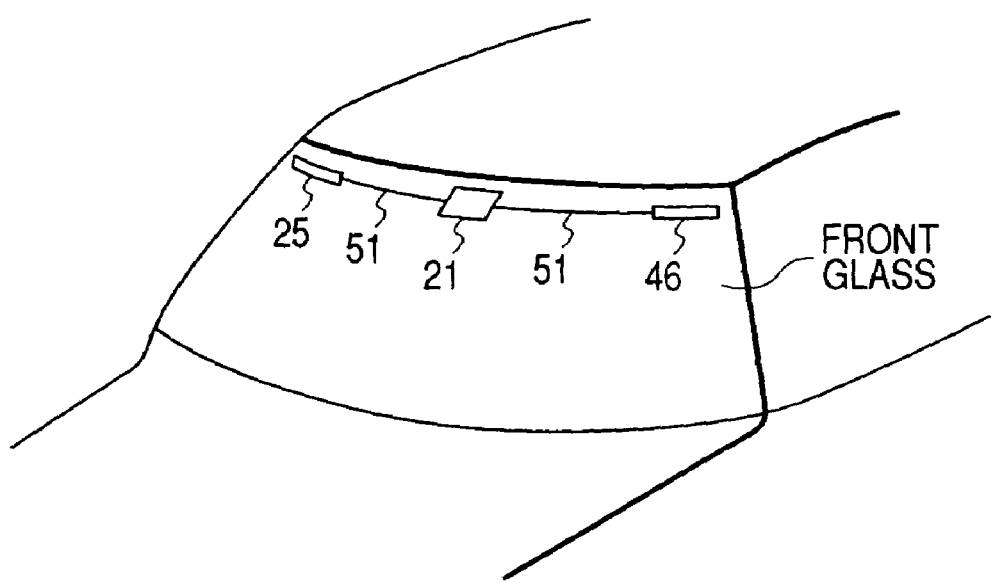
FIG. 8 is a view illustrating the mounting positions of antennas and the antenna module according to the invention.
Figure 9:
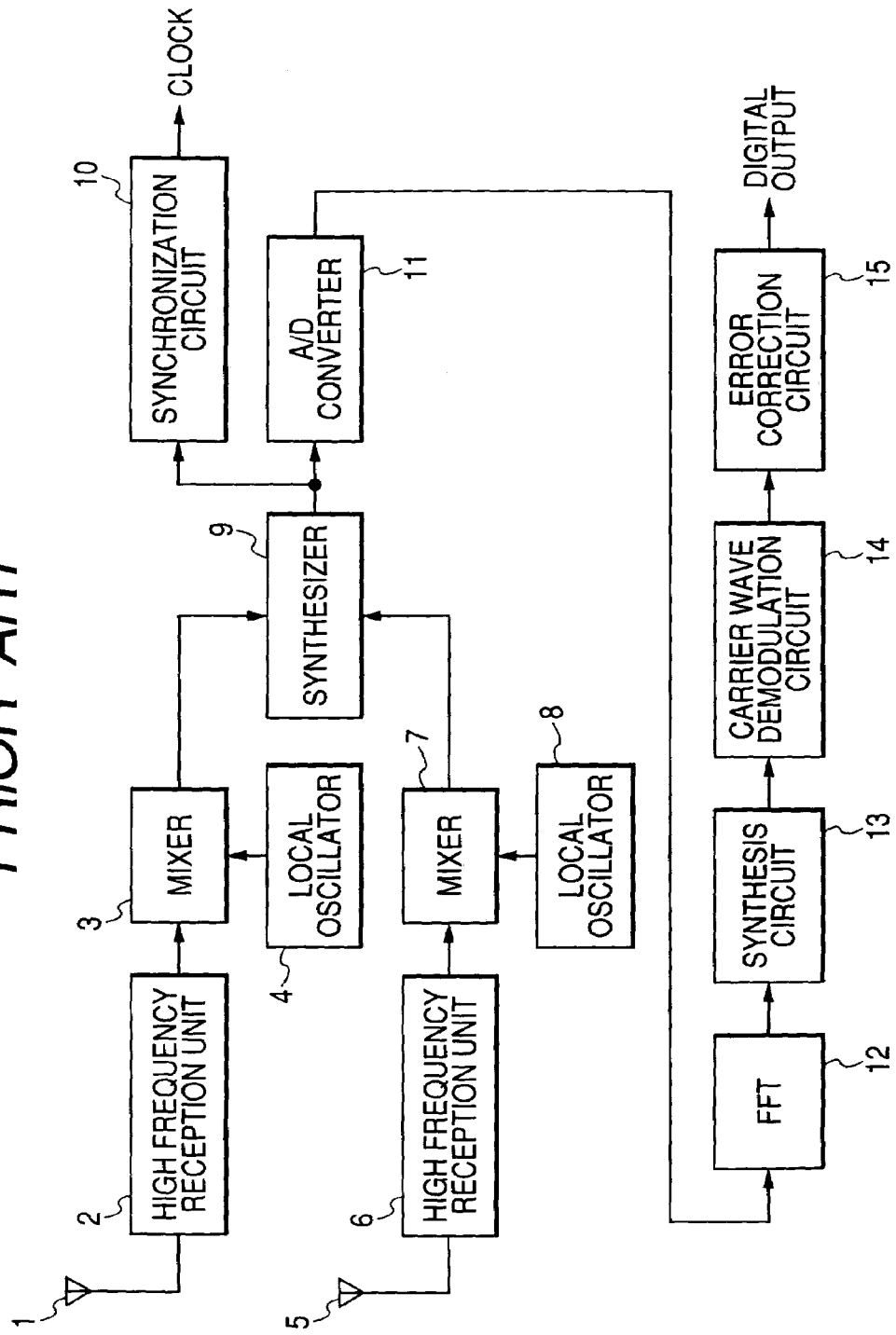
FIG. 9 is a block diagram illustrating a vehicle-mounted receiving apparatus according to the related art.

A vehicle-mounted receiving apparatus of the invention will be described with reference to FIGS. 1 to 8. FIGS. 1 to 5 show a first embodiment, FIG. 6 shows a second embodiment. FIG. 7 shows an operation mode of the vehicle-mounted receiving apparatus of the invention, and FIG. 8 shows an example of mounting positions of an antenna and an antenna module used in the invention.

Figure 1:
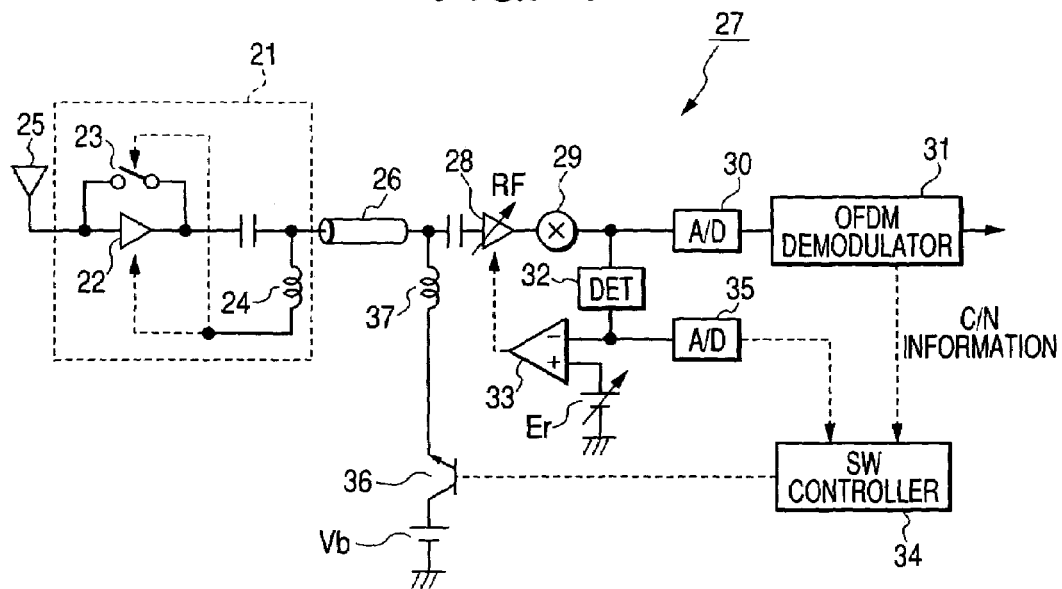
FIG. 1 is a block diagram illustrating a vehicle-mounted receiving apparatus according to the first embodiment of the invention.

Referring to FIG. 1, and antenna module 21, which is mounted on an inner side of a front glass or a rear glass of a vehicle, includes a first low-noise amplifier (hereinafter, referred to as LNA) 22 and a bypass circuit 23 connected in parallel to the fitrst LNA 22. The bypass circuit 23 is formed of a transistor and a so-called off-through switching circuit in which the bypass circuit is turned off when a direct current is applied thereto and the bypass circuit is turned on when power is not applied.

The input side of the antenna module 21 is connected to a first antenna 25, and the output side of the antenna module 21 is connected to a first cable 26. The first antenna 25 is mounted on a front glass or the like and receives terrestrial digital broadcasting signals. A power supply voltage is supplied to the first cable 26, and the power supply voltage is supplied to the first LNA 22 and the bypass circuit 23 through a chalk inductor 24.

A first receiving processing unit 27 connected to the first cable is disposed inside the vehicle. Hereinafter, the configuration of the first receiving processing unit 27 will be described. In the first receiving processing unit 27, a variable gain amplifier (RF amp) 28, a mixer 29 serving as a frequency converting unit, and A/D converter (analog/digital converter) 30, and a first OFDM demodulator 31 are connected in a cascade manner.

In addition, a carrier detector (DET) 32 serving as a receiving intensity detection unit is provided at the output side of the mixer 29. The detector 32 detects intermediate frequency signals output from the mixer 29 and then outputs a voltage proportional to the receiving intensity. The voltage is input to one input terminal (inverting input terminal) of an operational amplifier 33. A reference voltage Er is input to the other input terminal (non-inverting input terminal) of the operational amplifier 33. Then, an AGC voltage output from the operational amplifier 33 is supplied to a control terminal of the variable gain amplifier 28, and thus the gain of the variable gain amplifier 28 is controlled.

The A/D converter 30 converts intermediate frequency signals to digital signals and then outputs the digital signals to the first OFDM demodulator 31. The first OFDM demodulator 31 demodulates the A/D converted intermediate frequency signals and detects C/N during demodulation so as to output C/N information to a switch controller 34. Further, the voltage output from the carrier detector 32 is also input to the switch controller 34 through the A/D converter (analogue/digital converter) 35. That is, the A/D converted receiving intensity information and the C/N information are input to the switch controller 34.

The switch controller 34 controls an on/off state of a switching unit 36 on the basis of the receiving intensity information and the C/N information. The switching unit 36 is composed of a transistor; a power supply voltage Vb is applied to a collector of the transistor, and an emitter of the transistor is connected to the first cable 26 through the chalk inductor 37. The output of the switch controller 34 is coupled to the base of the switching unit 36. When the switching unit 36 is turned on, the power supply voltage Vb is supplied to the first and LNA 2 and the bypass circuit 23 through the first cable 26. On the other hand, when the switching unit 36 is turned off, the power supply voltage Vb is not supplied. The configuration of the first receiving processing unit 27 has been described hereinabove.

With the above-described configuration, the antenna module 21 switches between an amp mode, in which the first LNA 22 operates and the bypass circuit 23 is turned off when the power supply voltage Vb is supplied to the antenna module 21, and a bypass mode, in which the first LNA 22 does not operate and the bypass circuit 23 is turned on when the power supply voltage Vb is not applied to the antenna module 21.

As shown in FIG. 7, the antenna module 21 switches between the bypass mode and the amp mode on the basis of the receiving intensity and the C/N.

First, in the case that the receiving intensity is more than a predetermined value E and the C/N is less than a first predetermined value C1 (region A), when the first LNA 22 operates, distortion in post-stage circuits including the first LNA 22 increases, which further deteriorates the C/N during demodulation. For this reason, the switch controller 34 turns the switching unit 36 off so as to switches the antenna module 21 to the bypass mode. Accordingly, the first LNA 22 does not operate so as to turn on the bypass circuit 23, and thus receiving signals are transmitted to the cable 26 through the bypass circuit 23. In this way, it is possible to reduce power consumption and to keep the C/N from further deteriorating.

In addition, when the C/N is more than a second predetermined value C2 (region B), the receiving intensity and the C/N are sufficient, so that it is not necessary to operate the first LNA 22. Therefore, the antenna module 21 switches to the bypass mode so as to stop supplying a power supply voltage to the first LNA 22 and the bypass circuit 23. In this way, it is possible to reduce power consumption.

In addition, when the C/N is between the first predetermined value C1 and the second predetermined C2 (region C), there is a margin even though the C/N is deteriorated to some degree. In this case, since it is more advantageous to increase the receiving intensity rather than to increase the C/N, the antenna module 21 switches to the amp mode.

On the other hand, in the case that the receiving intensity is less than a predetermined value E, the antenna module 21 switches to the amp mode because it is necessary to increase the receiving intensity when the C/N is less than the first predetermined value C1, and is between the first predetermined value C1 and the second predetermined value C2 (region E).

Further, when the C/N is more than the second predetermined value C2 (region F), the receiving intensity is low but the C/N is sufficient. Therefore, the antenna module 21 switches to the bypass mode so as to reduce the power consumption.

Figure 2:
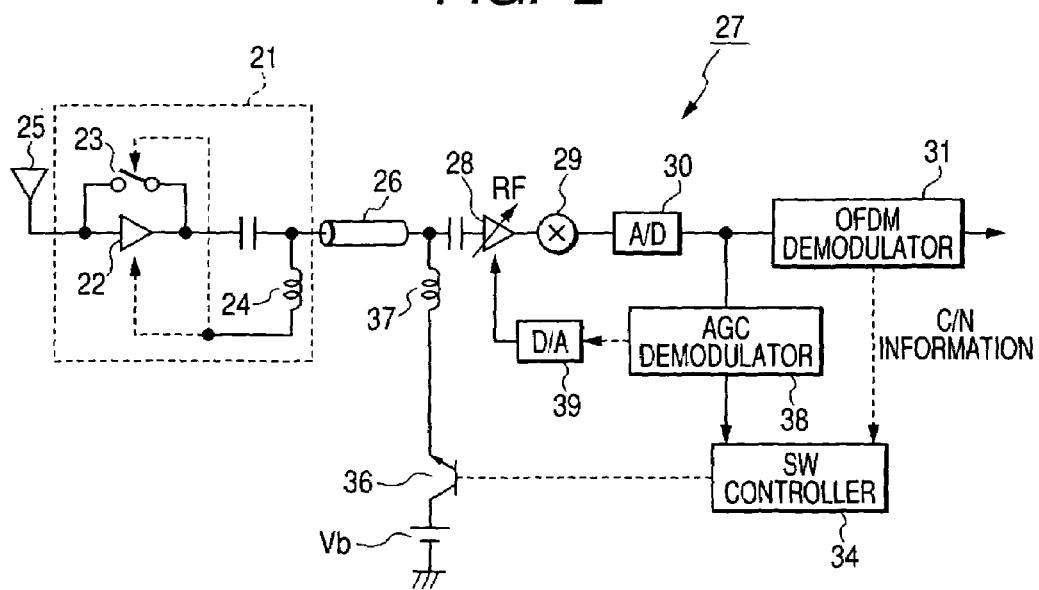
FIG. 2 is a block diagram illustrating a first modified example according to the first embodiment of the invention.

FIG. 2 shows a first modified example. Referring to FIG. 2, the configuration from the variable gain amplifier 28 to the first OFDM demodulator 31 is the same as that of FIG. 1. However, an AGC control circuit 38 serving as a receiving intensity detection unit is provided at the output side of the A/D converter 30. The AGC control circuit 38 outputs digital electric field intensity signals by using A/D converted intermediate frequency signals, which are output from the A/D converter 30, and then converts the output signals into analogue voltages by using a D/A converter 39 so as to supply the analogue voltages to the variable gain amplifier 28. In addition, the electric field intensity signals output from the AGC control circuit 38 are input to the switch controller 34. The C/N information is input to the switch controller 34 from the first OFDM demodulator 31. Even in this configuration, the mode switching of the antenna module 21 is the same as that of FIG. 7; however, since the electric field intensity signals are output as digital values, the electric field intensity signals can be input to the switch controller 34.

Figure 3:
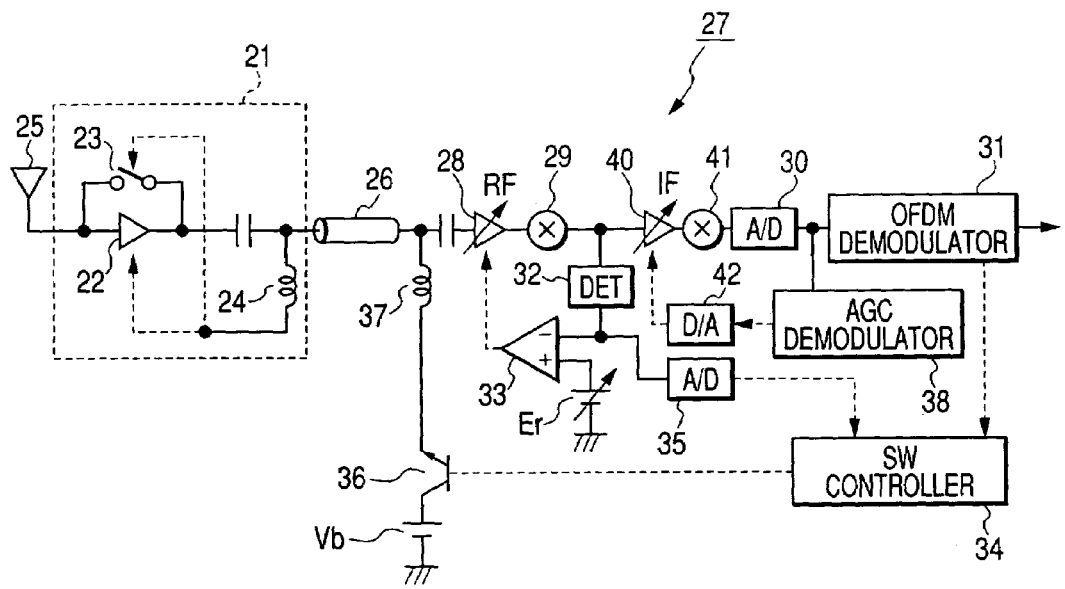
FIG. 3 is a block diagram illustrating a second modified example according to the first embodiment of the invention.
Figure 4:
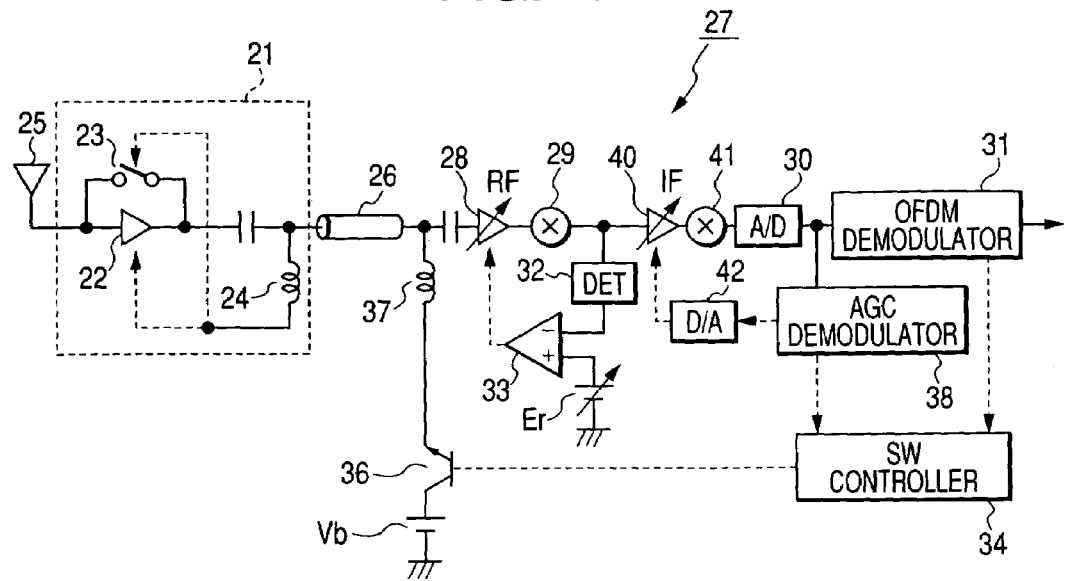
FIG. 4 is a block diagram illustrating a third modified example according to the first embodiment of the invention.

FIG. 3 shows a second modified example. Referring to FIG. 3, between the mixer 29 and the A/D converter 30, a second variable gain amplifier (IF amplifier) 40 and a second mixer 41 are connected in a cascade manner. Further, electric field intensity signals output from the AGC control circuit 38 are supplied to the second variable gain amplifier 40 through a D/A converter 42. The voltage of electric field intensity obtained from the output side of the mixer 29 is supplied to the variable gain amplifier 28, and then A/D converted so as to be supplied to the switch controller 34. In this configuration, frequency conversion is performed twice; therefore, it is possible to reduce image interference. In addition, since the variable gain amplifiers 28 and 40 having two steps are AGC controlled, intermediate frequency signals of a stable level can be input to the first OFDM demodulator 31. Further, as shown in a third modified example of FIG. 4, electric field intensity information may be supplied to the switch controller 34 from the AGC control circuit 38.

Figure 5:
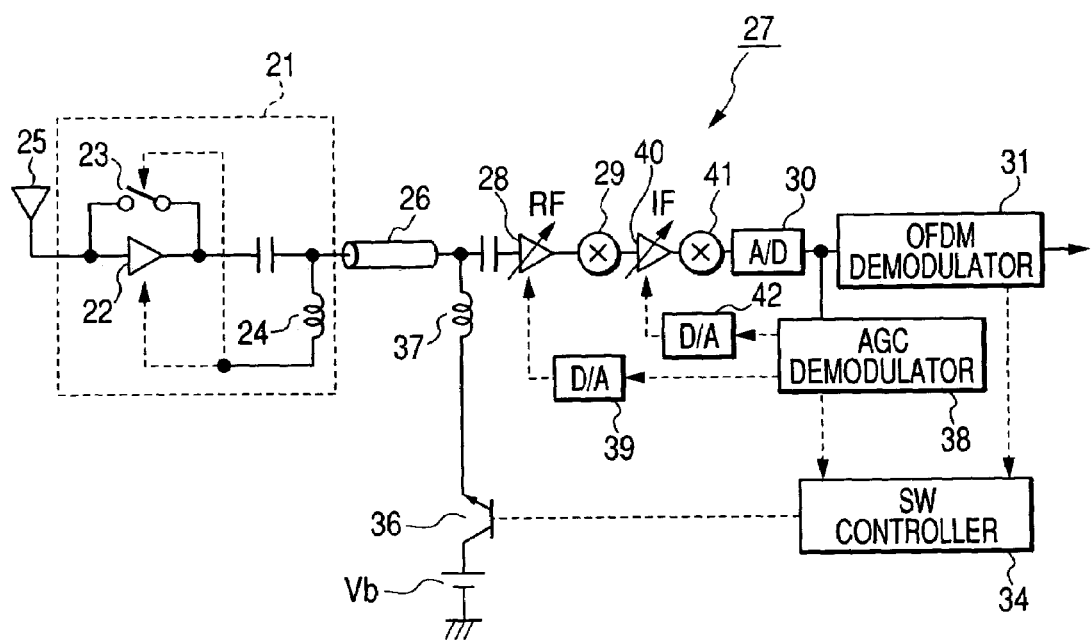
FIG. 5 is a block diagram illustrating a fourth modified example according to the first embodiment of the invention.

In addition, as shown in a fourth modified example of FIG. 5, AGC voltage may be supplied to the RF variable gain amplifier 28 from the AGC control circuit 38 through the D/A converter 39, or the AGC voltage may be supplied to the IF variable gain amplifier 40 through the D/A converter 42.

FIG. 6 shows the second embodiment. A second LNA 45 is provided in the antenna module 21. The second LNA 45 is connected to a second antenna 46, and the output of the second LNA 45 is connected to a second receiving processing unit 48 through a second cable 47 interposed therebetween. Signals that are received through the second antenna 46 are always input to the second LNA 45 regardless of variations in the electric field intensity.

A second demodulator 49 is provided in the second receiving processing unit 48, and an amplifier, a frequency converting unit, and A/D converter, and so on (not shown) are provided at the front stage of the second receiving processing unit 48, and A/D converted intermediate frequency signals are input to the second OFDM modulator 49. Further, demodulated signals output from the first OFDM demodulator 31 and demodulated signals output from the second OFDM demodulator 49 are synthesized at the maximum ratio (synthesized such that the C/N ratio becomes the maximum). Therefore, in the configuration shown in FIG. 6, a vehicle-mounted receiving apparatus can be designed to perform the diversity reception. Specifically, even though the mode switches due to the variations in the electric field intensity occurring at the first LNA 22 side, signals are always input to the second LNA 45, and therefore, the deviation of synchronization during the demodulation is prevented.

FIG. 8 is a view illustrating an example of mounting positions when the antenna module 21, the first antennaa 25, and the second antenna 46 are mounted on the front glass. The antenna module 21 is mounted on the upper middle part of the front glass so as not to obstruct the driver. The first and second antennas 25 and 46 are separately mounted on both sides of the antenna module 21 on the front glass. Each of the first and second antennas 25 and 46 is connected to the antenna module 21 by using an antenna cable 51.

In addition, hereinabove, the reception of the terrestrial digital broadcasting signals has been described; however, the application of the invention is not limited to the above-describe embodiments but can be applied to the reception of general broadcasting signals.

The invention claimed is:
1. A vehicle-mounted receiving apparatus comprising:
a first antenna that receives a broadcasting signal;
a first low-noise amplifier connected to the first antenna; and
a first receiving processing unit that is provided at a back stage of the first low-noise amplifier and detects at least the receiving intensity and the C/N during demodulation of the broadcasting signal,
wherein the first low-noise amplifier is connected to the first receiving processing unit through a first cable and a bypass circuit is provided in parallel to the first low-noise amplifier so as to bypass the first low-noise amplifier, and
in a case in which the intensity of the broadcasting signal is more than a predetermined value, when the C/N is more than a first predetermined value and less than a second predetermined value higher than the first predetermined value, the broadcasting signal is transmitted to the first cable through the first low-noise amplifier, and when the C/N is less than the first predetermined value or more than the second predetermined value, the broadcasting signal is not input to the first low-noise amplifier but transmitted to the first cable through the bypass circuit.

2. The vehicle-mounted receiving apparatus according to claim 1, wherein, in a case in which the intensity of the broadcasting signal is less than the predetermined value, when the C/N is less than the second predetermined value, the broadcasting signal is transmitted to the first cable through the first low-noise amplifier, and when the C/N is more than the second predetermined value, the broadcasting signal is not input to the first low-noise amplifier but transmitted to the first cable through the bypass circuit.

3. The-vehicle-mounted receiving apparatus according to claim 1, wherein the bypass circuit is formed of an off-through switching circuit in which the bypass circuit is turned off when a power supply voltage is applied and the bypass circuit is turned on when the power supply voltage is not applied, the first receiving processing unit is provided with a switching unit through which the power supply voltage is supplied to the first cable, the power supply voltage is supplied to the first low-noise amplifier and the off-through switching circuit through the first cable, and when the broadcasting signal is transmitted to the first cable through the first low-noise amplifier, the power supply voltage is supplied to the first cable through the switching unit, and when the broadcasting signal is transmitted to the first cable through the bypass circuit, the switching unit stops the power supply voltage from being supplied to the first cable.

4. The vehicle-mounted receiving apparatus according to claim 3, wherein the broadcasting signal is a terrestrial digital broadcasting signal that is OFDM demodulated, the first receiving processing unit includes a frequency converting unit, a first OFDM demodulator connected to a back stage of the frequency converting unit, a receiving intensity detection unit that detects the receiving intensity of the terrestrial digital broadcasting signal on the basis of an intermediate frequency signal output from the frequency converting unit, and a switch controller that controls an on/off state of the switching unit, and the first OFDM demodulator detects C/N information corresponding to the C/N value and outputs the receiving intensity information and the C/N information corresponding to the receiving intensity to the switch controller.

5. The vehicle-mounted receiving apparatus according to claim 4, wherein the first receiving processing unit includes a variable gain amplifier disposed at a front stage of the frequency converting unit, and a voltage corresponding to the receiving intensity is supplied to the variable gain amplifier so as to control the gain of the variable gain amplifier.

6. The vehicle-mounted receiving apparatus according to claim 4, further comprising:

a second antenna that receives a broadcasting signal;

a second low-noise amplifier connected to the second antenna; and a second receiving processing unit provided at a back stage of the second low-noise amplifier, wherein the second low-noise amplifier and the second receiving processing unit are connected to each other through a second cable, a second OFDM demodulator is provided in the second receiving processing unit, the terrestrial digital broadcasting signal is input to the second low-noise amplifier without being attenuated, regardless of variations in the receiving intensity of the terrestrial digital broadcasting signal, and a demodulated signal output from the first OFDM demodulator and a demodulated signal output from the second OFDM demodulator are input to a synthesizer.

7. The vehicle-mounted receiving apparatus according to claim 6, wherein the first low-noise amplifier, the bypass circuit, and the second low-noise amplifier are constructed inside the antenna module that is formed as one unit, and the antenna module and the first and second antennas are mounted on an inner side of a front glass or a rear glass of a vehicle, and the first and second antennas are mounted on both sides of the antenna module so as to be separated from each other.

8. The vehicle-mounted receiving apparatus according to claim 1, wherein the first low-noise amplifier and the bypass circuit are constructed inside an antenna module that is formed as one unit, and the antenna module and the first antenna are mounted on an inner side of a glass of a vehicle.

9. The vehicle-mounted receiving apparatus according to claim 8, wherein the first antenna is mounted on an inner side of a front glass or a rear glass of a vehicle.

* * * * *